(12) United States Patent
Motz et al.

(10) Patent No.: US 6,643,111 B1
(45) Date of Patent: Nov. 4, 2003

(54) ELECTRONIC TRANSDUCER DEVICE

(75) Inventors: Mario Motz, Wernberg (AT); Ulrich Theus, Gundelfingen (DE)

(73) Assignee: Micronas GmbH, Freiburg (DE)

( * ) Notice: Subject to any disclaimer, the term of this patent is extended or adjusted under 35 U.S.C. 154(b) by 283 days.

(21) Appl. No.: 09/616,327

(22) Filed: Jul. 15, 2000

(30) Foreign Application Priority Data

Jul. 15, 1999 (DE) .......................................... 199 33 096
Feb. 23, 2000 (DE) .......................................... 100 08 180

(51) Int. Cl.$^7$ ................................................. H02H 9/00
(52) U.S. Cl. ........................... 361/91.1; 361/58; 361/78
(58) Field of Search ........................... 361/90, 115, 58, 361/78, 91.1, 88

(56) References Cited

U.S. PATENT DOCUMENTS

| | | | |
|---|---|---|---|
| 4,612,453 A | 9/1986 | Yamazaki | 307/303 |
| 5,179,297 A | 1/1993 | Hsueh et al. | 307/296.6 |
| 5,243,236 A | 9/1993 | McDaniel | 307/443 |
| 5,473,253 A | 12/1995 | Araki | 324/537 |
| 5,530,394 A | 6/1996 | Blossfield et al. | 327/530 |

FOREIGN PATENT DOCUMENTS

DE          197 51 519 A1      5/1999   ............ G01B/7/02

*Primary Examiner*—Stephen W Jackson
(74) *Attorney, Agent, or Firm*—Samuels, Gauthier & Stevens, LLP

(57) ABSTRACT

To detect a fault state due to a line break in power supply lines on the receiving side during the operation of a transducer device, the transducer output voltage is forced to an extreme voltage range by a co-integrated p-channel-depletion-transistor. As a result, the signal detection device can reliably detect the presence of the fault state due to a line break in the supply feed lines.

8 Claims, 2 Drawing Sheets

ELECTRONIC TRANSDUCER DEVICE

BACKGROUND OF THE INVENTION

The invention relates to an electronic transducer device, and in particular to an electronic transducer device that includes overvoltage protection to protect the device from excessive supply voltage values.

Transducer devices often contain a sensor to measure an external state. The measured external state is conducted as an electrical signal to a signal detection device. Such transducers are often exposed to interference from breaks in the supply lines, especially a break of the ground conductor. Such breaks must be detected in many cases by the signal detection device to ensure that the value is not interpreted erroneously as a valid measured transducer signal.

Such transducer devices are used, for example, as substitutes for potentiometer arrangements, wherein the current position of a mechanical positioning device is queried by an electronic processing device (e.g., a processor). Broad applications are found, for example, in motor vehicles, when the positions of motor control equipment, brakes, headlights, seats, etc. are to be evaluated or stored. Since mechanical wear on such potentiometer arrangements eventually can result in faulty measurements or even in operational failures, contact-free measurement methods, which use sensors to detect the particular position, find increasing application. A similar application of such transducer devices concerns the measurement and transmission of temperature, pressure, moisture, brightness, and other physical quantities through appropriate sensors.

German patent application DE 197 51 519 A1, for example, describes a transducer device with a Hall sensor for a linear sensor, comprising two mechanical parts which can move relative to one another, and whose relative position is measured by the transducer device. The transducer device contains a fault alarm circuit that emits a defined voltage signal if the grounding conductor is interrupted. In applications intended for motor vehicles, one of the three connecting lines of the transducer device can easily be disconnected because the linear sensor is subject to severe vibrations, and three connecting lines connect the transducer device to a plug connector on the linear sensor, from which plug connector three conductors then go to the evaluation and supply circuit. The fault alarm circuit contains an n-channel-depletion-MOS-field effect transistor, which is connected between the positive operating voltage line and the output line of the transducer device. In the normal operating state—that is without any line breaks—a DC converter fed from the operating voltage sets the gate electrode of the depletion transistor to a sufficiently low potential so that the depletion transistor is blocked. For example, the gate potential lies 1 V below the ground potential. If the ground conductor is disconnected, the DC converter ceases to function, and its output voltage thus corresponds to the operating voltage. Thus the depletion transistor becomes fully conducting, so that it raises the potential of the output line approximately to the operating voltage, and this is recognized by the signal detection device as a faulty signal. A break in the operating voltage line is less critical, because in this case the transducer output assumes ground potential, which the receiving side easily recognizes as a faulty signal. It is further specified that the entire transducer device with its fault alarm circuit can also be integrated as a microelectronic switching circuit and that this represents a preferred embodiment.

Commonly assigned European patent application EP 0 648 019 A2 describes a monolithically integrated voltage regulator in CMOS technology. To protect against wrong poling, it contains an MOS transistor structure, connected in series with the voltage regulator. In the event of wrong poling, this MOS transistor structure reduces the resulting mis-poling current to such an extent that destruction of the monolithically integrated circuit is prevented. Furthermore, the described embodiment also contains circuit measures to enable operation from a supply voltage which is higher than would be permissible according to the basic production standard, for example a standardized CMOS technology.

There is a need for an electronic transducer device that includes the ability to detect a break in a power supply line.

SUMMARY OF THE INVENTION

It is an object of the invention to adapt the known transducer device to a standardized production process for monolithically integrated circuits, especially a CMOS production process. An additional object is to take precautions to prevent destruction of the monolithically integrated circuit when an overvoltage is applied and/or when the poling of the connections is reversed.

A monolithically integrated transducer device includes a p-channel-depletion-transistor, controlled by a charge pump and situated in its own n-well between the operating voltage connection and the signal output. Under normal operation, when the operating voltage and the ground potential are present at the transducer device and thus at the charge pump, this transistor is blocked; when the ground conductor is disconnected, this transistor becomes conducting. The n-well in the p-conducting substrate is connected to the operating voltage connection via a co-integrated resistor. The charge pump and the depletion transistor form the fault alarm circuit. Using the p-channel-depletion-transistor in its own well achieves the result that this transistor can be blocked with a positive voltage and thus all voltages are higher than the potential at the substrate of the monolithically integrated circuit.

When converting the transducer device into a monolithically integrated circuit, care must be taken to protect the transducer device against interchange of the connections when the operating voltage is applied. Through a wrongly applied operating voltage, zones in the: monolithically integrated circuit which are otherwise blocked are brought into the forward conducting state, which can sometimes cause a high current flow, which finally results in destruction of the component. To achieve this intended protection against an interchange of the connections of the operating voltage, the invention specifies that the n-well of the MOS-depletion-transistor is connected to the operating voltage, not directly as usual, but via a co-integrated resistor. A current which flows through the well in the event of mis-poling, is thus limited at least by this resistor. The depletion transistor, situated between the operating voltage connection and the signal output, is thus also protected against accidental application of the operating voltage to the signal output.

To detect a break in the operating voltage line on the receiver side, a further development of the invention specifies that the signal output of the transducer device and/or the signal input of the receiving device is connected to ground potential via a co-integrated or external resistor, which pulls the signal output quickly to ground potential, independently of parasitic currents or capacitances. The resistor to ground at the signal input of the receiving device is used to facilitate detection of a break in the external signal line. The resistors to ground here have a much higher ohm resistance than the internal resistance of the transducer device.

If the operating voltage is higher than the maximum voltage prescribed for the particular circuit technology, that is also in the case of brief overvoltages, which can occur, for example, during operation in a motor vehicle, the depletion transistor should be protected against excessive voltages. For this purpose, a preferred further development of the invention specifies that the excessive voltage is divided among two series-connected p-channel-depletion-transistors. In normal operation, one of these is in the blocked state and the other is connected as a cascode transistor and thus is conducting. Its gate is controlled through a driver circuit which generates the cascode control voltage. The output voltage of this driver circuit lies about halfway between the respective operating voltage and the ground potential, so that the excessive operating voltage is divided about equally among the two p-channel-depletion-transistors. If the ground conductor becomes disconnected, the absence of drive voltages makes both p-channel-depletion-transistors conducting, and these pull the signal output approximately up to the applied operating voltage. To protect the remaining circuit against an excessive operating voltage, cascode stages are also suitably used, such as are described in detail, in our own, above-referenced, European Patent Application EP-0 648 019 A2, which is hereby incorporated by reference. Repetition of this description thus is not necessary.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
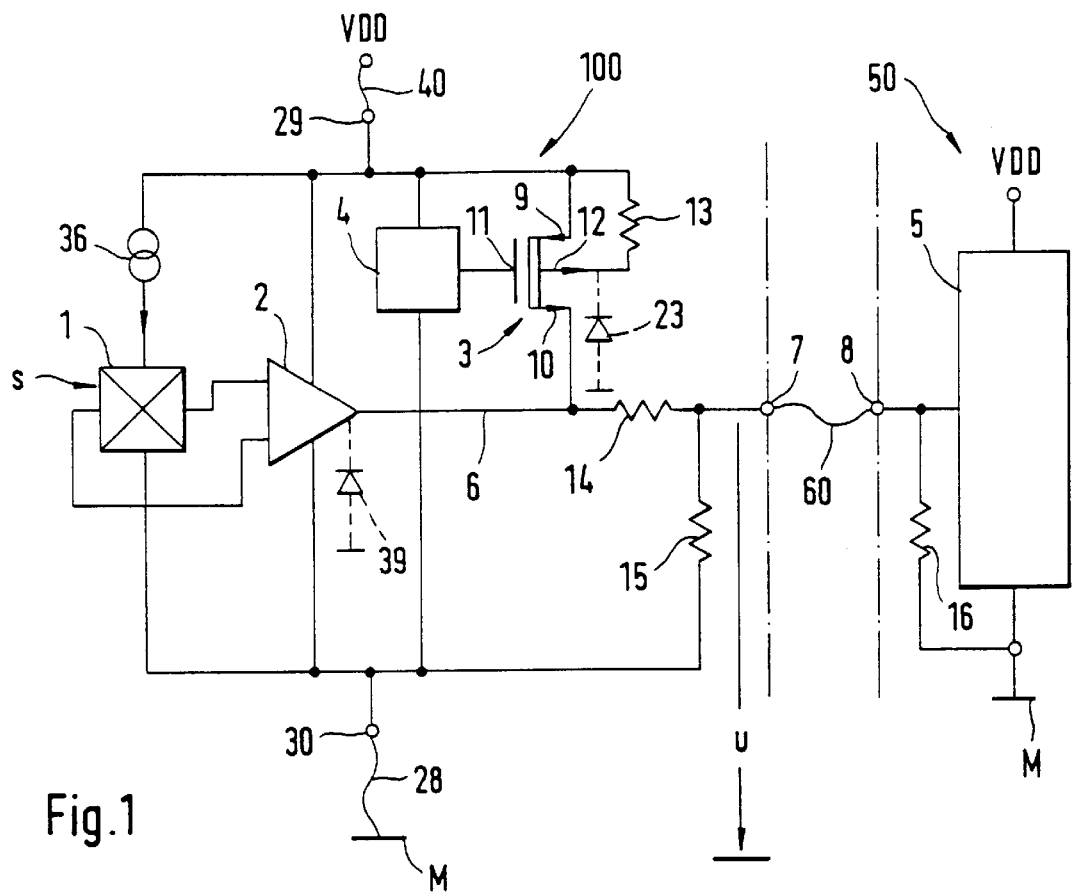
FIG. 1 is a block diagram illustration of an inventive transducer device.

FIG. 1 is a block diagram illustration of an embodiment of a transducer device 100 with a sensor 1. Through an external signal line 60, the transducer device 100 delivers sensor signals that correspond to the value of a measured external state s, to a receiving device 50. For example, this signal can be an analog signal, namely an output voltage u at the signal output 7. Its dependence can be linear or can follow a given curve. The transducer device 100 includes the sensor 1, which can be, for example, a Hall sensor fed from a current source 36, an amplifier 2, a p-channel-depletion-transistor 3 in MOS technology, and a charge pump 4. Operating voltage VDD is conducted via an external operating voltage feed line 40 to an operating voltage connection 29, and ground potential M is conducted, via an external ground line 28, to a ground connection 30. The analog outputs of the sensor 1 deliver the sensor signal as a differential signal to the amplifier 2. The sensor signal is amplified by a defined factor in the amplifier 2, and the resultant signal is provided on an internal signal line 6, which is connected via a protective resistor 14 to a signal output 7 of the transducer device 100. The protective resistor 14 protects the signal output 7 and the associated circuit parts in the event a voltage is applied to the signal output 7 that is more negative than the voltage for the ground potential M at the connection 30. This may happen, for example, if the ground potential M is accidentally applied to the signal output 7, and the operating voltage VDD is accidentally applied to the ground connection 30. In the block circuit diagram of FIG. 1, the well-substrate-diode 23 of the p-channel-depletion-transistor 3 and the drain-substrate-diode of the n-channel transistor—which, in a conventional push-pull end stage of the amplifier 2—is present as a parasitic element—are schematically shown as dashed diode symbols. If the connections 29, 30, 7 are interchanged, the forward directions of these diodes must be taken into account.

The output voltage u is evaluated by a receiving device 50 that includes a signal detection device 5, whose signal input 8 is connected to the signal output 7 of the transducer device 100, through a more or less long external signal line 60. With an operating voltage VDD of 5 volts, the output voltage u normally spans an average voltage range between the operating voltage VDD and the ground potential M, which, for example, lies between 0.5 volt and 4.5 volt. Output voltages u outside this range are detected by the signal detection device 5 as error signals, and indicate a fault state of the entire system, but especially of the transducer device 100 or the signal line 60.

The p-channel-depletion-transistor 3 has a source connection 9, a drain connection 10, a gate connection 11, and a well connection 12. The source connection 9 is connected to the operating voltage connection 29; the drain connection 10 is connected to the internal signal line 6; the gate connection 11 is connected to an output of the charge pump 4; and the well connection 12 is connected, via a first resistor 13, to both the source connection 9 and the operating voltage connection 29. As already mentioned, the resistor 13 serves as protection against an interchange of the operating voltage and ground connection. The signal output 7 is connected to the ground connection 30 via a second resistor 15, and the signal input 8 of the signal detection circuit 5 is connected to the ground potential M there via a third resistor 16. As already specified, this serves to detect a break in the external signal line 60.

With a normal operating voltage VDD (e.g., +5 V), the output of the charge pump 4 delivers to the transistor 3 a gate voltage that is higher than the sum of the positive operating voltage VDD and a positive pinch-off voltage VTH of the transistor 3. Its p-conducting depletion-channel 38 (FIG. 3) is thus completely pinched off and blocked, so that current does not flow between the source and drain connection 9 and 10, respectively. The transistor 3 is thus brought to a nonconducting state, and the amplified sensor signal reaches the signal output 7 without being affected, and thus can be associated with a state variable s.

If the feed line 28 for the ground potential M is interrupted, the charge pump 4 stops operating, and the gate voltage at the transistor 3, which is higher than the operating voltage VDD, decreases. This makes the transistor 3 conducting, and pulls the signal output 7 approximately to the value of the operating voltage VDD (e.g., approximately to the usual 5 volt). The signal detection device 5 interprets this value of the output voltage u as the presence of a fault state. If the feed line 40 for the operating voltage VDD is disconnected, the charge pump 4 also stops operating. Without the operating voltage VDD, the signal output 7 assumes the ground potential M or, without one of the resistors 15, 16, in any case remains floating.

If the relatively long signal line 60 is interrupted, the third resistor 16 pulls the signal input 8 of the signal detection device 5 toward ground. The signal detection device 5 then interprets this value of the output voltage u again as the presence of a fault state.

Figure 2:
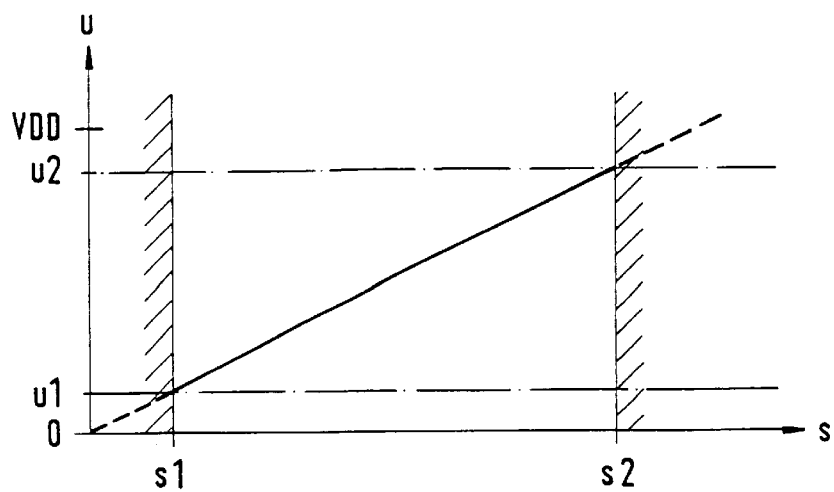
FIG. 2 is a plot of transducer device output voltage as a function of the state variable s that is measured.

FIG. 2 is a plot of output voltage u of the transducer device 100 as a function of the state variable s that is being measured. As a rule, the measurement range of the state variable s is limited by physical and/or mechanical givens, as is shown in FIG. 2 by a first and second state value s1, s2. The amplification of the sensor signal is matched to these state values s1, s2 so that the excursion range of the output voltage u contains these state values s1, s2 as a first and second limit u1, u2 of its excursion range. For example, with an operating voltage VDD of 5 volt, 0.5 volt and 4.5 volt are suitable limits. Therefore, if the receiving device 50 sees a voltage u between 0 volt and 0.5 volt or a voltage u above 4.5 volt at the signal input 8, these voltages u are interpreted as the presence of a fault state. On the other hand, with voltages u between 0.5 volt and 4.5 volt, the magnitude of the voltage u is interpreted as a measured state value s within the nominal operating range.

Figure 3:
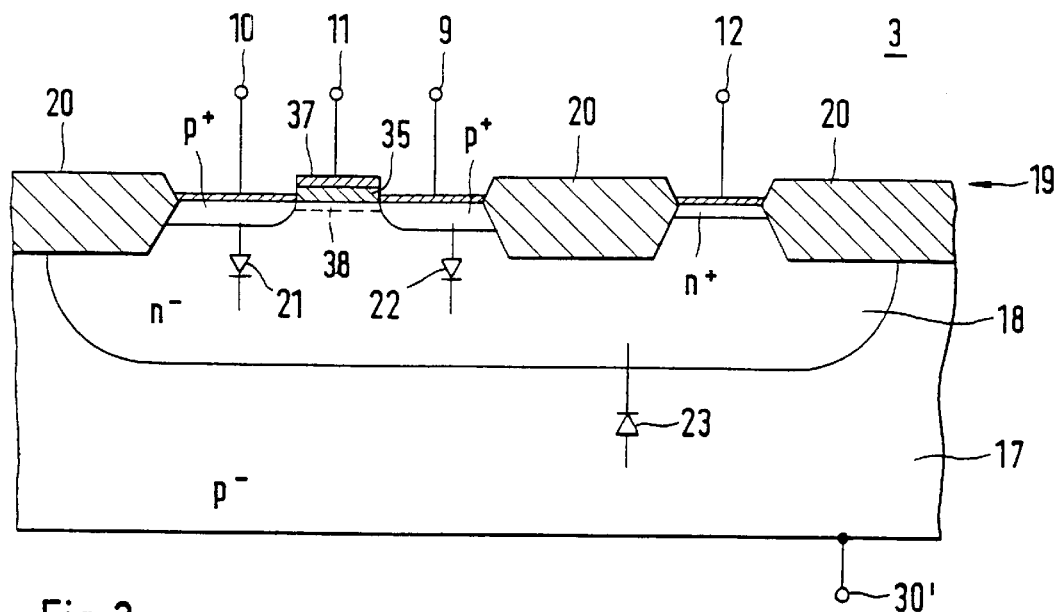
FIG. 3 is a sectional view of the MOS-depletion-transistor of FIG. 1.

FIG. 3 schematically illustrates the structure of the monolithically integrated p-channel-depletion-transistor 3, designated below generally as transistor 3 for the sake of simplicity. An n-well 18 is embedded in a p-substrate 17. The source connection 9, the drain connection 10, the gate connection 11, and the well connection 12 are situated at a top side 19 of the n-well 18. The source connection 9 and the drain connection 10 are each contacted with a p$^+$-zone inside the n-well 18. The gate connection 11 is connected to a gate electrode of polycrystalline silicon 37 or with a metal coating, and the well connection 12 is formed by an n$^+$-zone inside the n-well 18. Furthermore, the thin gate oxide layer 35 and the p-conducting channel zone 38 directly under this are also shown schematically. The sectional picture of the individual blocking layers also shows the diode symbols, so that, if the connections are interchanged, the current flow directions associated with the individual blocking layers can be clearly seen. The drain-well-diode 21, the source-well-diode 22, and the well-substrate-diode 23 are shown. The field oxide layers 20, which adjoin the n$^+$- or p$^+$-zones, between the source connection 9 and the well connection 12, provide insulation. Since the depletion transistor 3 is of the p-channel type, the current between the source and the drain decreases as the voltage at the gate connection 11 increases.

If the connections 29 and 30 for the operating voltage VDD and the ground potential M are interchanged, the well-substrate-diode 23 becomes conducting. In the case of wrong poling, a current thus flows from the substrate 17—which, for example, is conductively connected to the ground connection 30 via its own substrate connection 30'—through the well-substrate-diode 23, to the well connection 12. The separate resistor 13, shown in FIG. 1, prevents this mis-poling current from rising too much. This resistor is designed, for example, as a polysilicon resistor, and it is connected between the well connection 12 and the source connection 9. Due to its current-limiting action, it protects the transistor 3 from destruction in the case of mis-poling.

Figure 4:
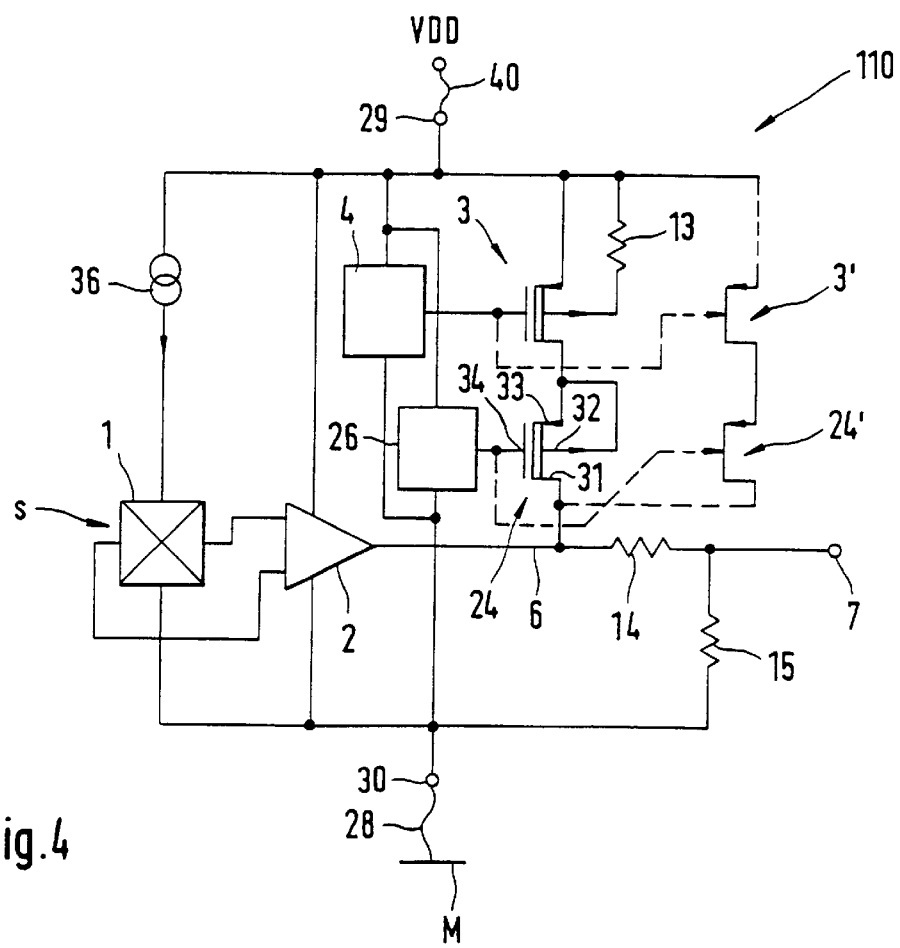
FIG. 4 illustrates an alternative embodiment transducer device that includes protective measures against overvoltages at the operating voltage connection.

FIG. 4 illustrates an alternative embodiment of a transducer device 110 with protective measures against overvoltages at the operating voltage connection 29. To protect the depletion transistor 3 against overvoltage, a p-channel-depletion-cascode transistor 24 is connected in series with it. This transistor will be designated below generally as cascode transistor 24, for the sake of simplicity. Its source connection 33 is connected to the transistor 3, and its drain connection 31 is connected to the internal signal line 6. A gate connection 34 of the cascode transistor 24 is connected to a driver circuit 26. The driver circuit 26 is coupled to the operating voltage 29 and the ground connection 30. To drive the cascode transistor 24, it delivers a voltage which lies approximately midway between the operating voltage VDD and the ground potential M. If an overvoltage at the operating voltage connection 29 occurs during the course of operation, this voltage will drop about half-and-half over the blocked transistor 3 and the conducting cascode transistor 24, in accordance with the given cascode drive voltage, so that an impermissible overvoltage at the transistor 3 and at the cascode transistor 24 is avoided. In the circuit arrangement with overvoltage protection, as shown in FIG. 4, alternatively two series-connected depletion-blocking layer-field effect transistors 3', 24' are connected in parallel to the series circuit that includes the transistor 3 and the cascode transistor 24. The control electrodes of the transistors 3', 24' are driven by the charge pump 4 or by the driver circuit 26, respectively. These and other alternatives can derive, for example, from the particular production processes available.

In principle, it is also possible to provide an n-conducting substrate for the monolithic integration, and to match the conductivity appropriately to the individual zones. This circuit arrangement then functions in the same manner as regards detection of a break in the ground or signal line, as do the embodiments described above.

The detection of a line break in the ground conductor is described in detail in the embodiment. Of course, a p-channel-depletion-transistor, controlled by a charge pump, can also be connected between the ground connection and the signal output. When the positive supply voltage VDD is interrupted, the charge pump does not deliver an output voltage, and thus the conducting p-channel-depletion-transistor forces the signal output to ground potential. This can be of interest if, for example, the signal output is designed as an open drain: output, and the receiver senses the digital sensor signal through the particular potential at a load resistor, as a "high" or "low" state. In this case, this "pull-up" resistor would simulate a positive potential, even though the positive supply line for the transducer has a break. The resistance of the p-channel-depletion-transistor in the conducting case should be small compared, to the "pull-up" resistance, so that the voltage at the signal output will be as close as possible to the ground potential, if possible even below the usual "low" value.

Although the present invention has been shown and described with respect to several preferred embodiments thereof, various changes, omissions and additions to the form and detail thereof, may be made therein, without departing from the spirit and scope of the invention.

What is claimed is:

1. A transducer device that provides a signal output, and is connected to a ground conductor and to a voltage conductor, said transducer device comprising:
   a fault alarm circuit that forces a prescribed potential at said signal output through a first p-channel-depletion-transistor situated in an n-well of a p-conducting substrate, when there is a break in the ground conductor, said n-well of said p-channel-depletion-transistor is connected to said operating voltage connection via a first resistor,
   a gate connection of said p-channel-depletion-transistor is coupled to and controlled by a charge pump, which is situated between the operating voltage connection and the ground connection, and in a normal operating state, the output voltage of said charge pump is sufficiently high to block said p-channel-depletion-transistor, whereas, if the ground conductor has a break, said p-channel-depletion-transistor conducts and pulls said signal output approximately to the operating voltage to protect said transducer device, wherein said signal output is connected to the ground connection through a second resistor.

2. The transducer device of claim 1, further comprising a protective resistor having a first lead connected with a signal line of the transducer device and a second lead connected to provide said signal output, so as to limit current flow when a voltage is applied to the signal output.

3. The transducer device of claim 1, further comprising:

a second p-channel-depletion-cascode transistor connected in series with said first p-channel-depletion-transistor, wherein said second p-channel depletion cascode resistor comprises an associated n-well connected to a source connection of said first p-channel-depletion-cascode transistor, wherein a gate connection of said second p-channel-depletion-cascode transistor is controlled by a driver circuit, which is situated between the operating voltage connection and the ground connection, and in normal operation, the output voltage of said driver circuit is about half the value of the voltage value provided by the operating voltage connection.

4. The transducer device of claim 3, wherein an n-conducting substrate is used for monolithic integration of said transducer device, and the conductivity is matched appropriately to the various zones.

5. The transducer device claim 2, wherein said signal output is connected, via an external signal line, to a receiving device, which contains a signal detection device, and which detects the presence of an analyzable sensor signal or of a fault state.

6. The transducer device of claim 5, wherein said signal output is connected to the ground connection.

7. A transducer device that provides a signal output, and when there is a break in either a first or second power supply line of said transducer device, said device forces a prescribed potential at said signal output, said transducer device comprising:

a fault alarm circuit that includes a p-channel-depletion-transistor, which is situated in an n-well of a p-conducting substrate, and which is coupled to the first and second power supply lines and to the signal output, said n-well of said p-channel-depletion-transistor is connected to the first power supply line through a first integrated resistor, a gate connection of said p-channel-depletion-transistor is controlled by a charge pump, which is situated between the first power supply line and the second power supply line, and in normal operation, the output voltage of said charge pump is sufficiently high to block the p-channel-depletion-transistor, whereas, in the case of a disconnection of either the first or second power supply lines, said charge pump can no longer block said p-channel-depletion-transistor, as a result of which said transistor provides said signal output at a value approaching the value of the first or second power supply line still connected to the device, wherein said signal output is connected to said second power supply line through a second resistor.

8. The transducer device of claim 7, wherein said second resistor is configured and arranged as an integrated resistive device.

* * * * *